(12) United States Patent
Hiblot et al.

(10) Patent No.: US 11,038,067 B2
(45) Date of Patent: Jun. 15, 2021

(54) STRESS SENSOR SUITABLE FOR MEASURING MECHANICAL STRESS IN A LAYERED METALLIZATION STRUCTURE OF A MICROELECTRONIC COMPONENT

(71) Applicant: IMEC VZW, Leuven (BE)

(72) Inventors: Gaspard Hiblot, Leuven (BE); Luka Kljucar, Leuven (BE)

(73) Assignee: IMEC vzw, Leuven (BE)

( * ) Notice: Subject to any disclaimer, the term of this patent is extended or adjusted under 35 U.S.C. 154(b) by 113 days.

(21) Appl. No.: 16/676,882

(22) Filed: Nov. 7, 2019

(65) Prior Publication Data

US 2020/0152804 A1    May 14, 2020

(30) Foreign Application Priority Data

Nov. 8, 2018    (EP) .................................... 18205087

(51) Int. Cl.
*H01L 29/84*    (2006.01)
*G01L 1/20*    (2006.01)
(Continued)

(52) U.S. Cl.
CPC .............. *H01L 29/84* (2013.01); *G01L 1/205* (2013.01); *H01L 23/528* (2013.01);
(Continued)

(58) Field of Classification Search
CPC . H01L 29/84; H01L 23/528; H01L 29/41733; H01L 29/43; H01L 29/458; G01L 1/205
See application file for complete search history.

(56) References Cited

U.S. PATENT DOCUMENTS

| 2004/0012057 A1 | 1/2004 | Bennett et al. |
| 2007/0194450 A1 | 8/2007 | Tyberg et al. |

(Continued)

FOREIGN PATENT DOCUMENTS

CN    107462350 A1    12/2017

OTHER PUBLICATIONS

Mosser, V. et al., "Piezoresistive Pressure Sensors Based on Polycrystalline Silicon", Sensors and Actuators A, vol. 28, No. 2, Jul. 1991, pp. 113-132.

(Continued)

*Primary Examiner* — Victor A Mandala
*Assistant Examiner* — Colleen E Snow
(74) *Attorney, Agent, or Firm* — McDonnell Boehnen Hulbert & Berghoff LLP (57) ABSTRACT

A sensor for measuring mechanical stress in a layered metallization structure such as the back end of line portion of an integrated circuit die is provided. The sensor operates as a field effect transistor comprising a gate electrode, gate dielectric, channel and source and drain electrodes, wherein the gate electrode is a conductor of a first metallization level and the source and drain electrodes are two interconnect vias, connecting the channel to respective conductors in an adjacent level. At least one of the interconnect vias is formed of a material whereof the electrical resistance is sensitive to mechanical stress in the direction of the via. The sensitivity of the electrical resistance to the mechanical stress is sufficient to facilitate measurement of the stress by reading out the drain current of the transistor. The sensor thereby allows monitoring of stress in the BEOL prior to cracking.

20 Claims, 6 Drawing Sheets

(51) Int. Cl.
*H01L 23/528* (2006.01)
*H01L 29/417* (2006.01)
*H01L 29/43* (2006.01)
*H01L 29/45* (2006.01)

(52) U.S. Cl.
CPC ........ *H01L 29/41733* (2013.01); *H01L 29/43* (2013.01); *H01L 29/458* (2013.01)

(56) References Cited

U.S. PATENT DOCUMENTS

2016/0377497 A1    12/2016  Nackaerts et al.
2018/0261698 A1*   9/2018   Lim .................... H01L 21/2233

OTHER PUBLICATIONS

European Search Report, European Patent Application No. 18205087.2, dated May 22, 2019, 10 pages.

* cited by examiner

STRESS SENSOR SUITABLE FOR MEASURING MECHANICAL STRESS IN A LAYERED METALLIZATION STRUCTURE OF A MICROELECTRONIC COMPONENT

CROSS-REFERENCE TO RELATED APPLICATIONS

The present application is a non-provisional patent application claiming priority to European Patent Application No. 18205087.2, filed Nov. 8, 2018, the contents of which are hereby incorporated by reference.

FIELD OF THE DISCLOSURE

The application is related to the measurement of mechanical stress in a micro-electronic component, such as an integrated circuit die.

BACKGROUND

The increased use of low-K dielectric material in the back end of line (BEOL) manufacturing process of integrated circuit (IC) dies has led to issues involving the mechanical stability of the die. Low-K material is mechanically fragile and can easily crack. The weak points where cracking is likely to occur are dependent on the pattern of vias in the BEOL layout. Areas with lower via density are mechanically weaker. Cracks often occur during packaging or related post-processing operations of the integrated circuit. Apart from crack formation, mechanical stress in the direction perpendicular to the layers of the BEOL portion may cause delamination of such layers, leading to failure of the chip. Current implementations are mostly limited to BEOL sensors based on a connectivity check for detecting the appearance of cracks. However these implementations are incapable of determining stress build-up prior to crack formation. Capacitive stress sensors in the BEOL are known, for example from document US2016/0377497. However this type of sensor is not suited for localized stress sensing, as it requires the application of small capacitances which are difficult to measure accurately. The problem of crack formation and propagation in the BEOL may be addressed by redesigning the BEOL layout. However current redesigns are done on a trial-and-error basis: redesigns are done until the layout proves to be crack-resistant during packaging for example. This approach increases the design time and manufacturing cost of the chip.

SUMMARY

The embodiments disclosed herein aim to provide a stress sensor that can be incorporated in the back end of line portion of an IC, and that answers to the above-cited problems of presently known implementations. This aim is achieved by a sensor and by micro-electronic components in accordance with the appended claims. An embodiment is related to a sensor for measuring mechanical stress in a layered metallization structure such as the back end of line portion of an integrated circuit die. The sensor operates as a field effect transistor comprising a gate electrode, gate dielectric, channel, and source and drain electrodes, wherein the gate electrode is a conductor of a first metallization level and the source and drain electrodes are two interconnect vias, connecting the channel to respective conductors in an adjacent level. At least one of the interconnect vias is formed of a material of which the electrical resistance is sensitive to mechanical stress in the direction of the via. The sensitivity of the electrical resistance to the mechanical stress is sufficient to facilitate measurement of the stress by reading out the drain current of the transistor when the transistor is in the ON state. The sensor thereby allows monitoring of mechanical stress in the BEOL prior to cracking. The sensor is based on measuring changes in electrical resistance and is thereby suited for localized stress sensing.

The embodiment is in particular related to a stress sensor incorporated in a layered structure, the layered structure comprising multiple levels comprising electric conductors and via connections for interconnecting the conductors of different levels, the conductors and via connections of the levels being embedded in layers of a dielectric material, the stress sensor comprising:

A first conductor in a first level of the layered structure, the first conductor performing the function of the gate electrode of a transistor, A dielectric layer in contact with the first conductor, the layer performing the function of the gate dielectric of the transistor, A portion of semiconductor material on the dielectric layer, the portion performing the function of the channel of the transistor, A first and second via in electrical contact with the channel, the first and second via respectively performing the function of source and drain electrodes of the transistor, the vias being electrically connected to respective conductors in a second level adjacent to the first level, wherein at least one of the vias, hereafter termed 'pseudo-via', is formed of a material whose electrical resistance is sensitive to mechanical stress acting on the layered structure in the direction of the vias, and wherein the sensitivity of the resistance of the at least one pseudo-via to the mechanical stress is sufficient to facilitate measurement of the stress by reading out the drain current of the transistor, when the transistor is in the ON state.

According to an embodiment, the channel and the at least one pseudo-via are formed of the same material. In the latter case, the at least one pseudo-via and the channel may be doped and the dopant density in the at least one pseudo-via may differ from the density in the channel.

According to an embodiment, the at least one pseudo-via is formed of amorphous silicon or polycrystalline silicon. According to another embodiment, the at least one pseudo-via is formed of Indium Gallium Zinc Oxide (IGZO). According to an embodiment, both the first and second via are pseudo-vias.

According to an embodiment, only the first via is a pseudo-via, and wherein the second via is connected to the channel through a contact material between the second via and the channel.

According to an embodiment, the sensitivity of the resistance of the at least one pseudo-via is higher than or equal to 50 ppm/MPa.

The embodiment is equally related to a micro-electronic component comprising a layered structure, the layered structure comprising multiple levels comprising electric conductors and via connections for interconnecting the conductors of different levels, the conductors and via connections of the levels being embedded in layers of a dielectric material, and wherein at least one sensor described according to the embodiment is incorporated in the layered structure of the micro-electronic component.

According to an embodiment of the component, multiple sensors are distributed across the surface area at least part of the layered structure, and wherein the multiple sensors are accessible through respective word lines coupled to the gate electrodes of the sensors, and through a plurality of bit lines, each bit line interconnecting the source or drain electrodes of a subgroup of sensors. The sensors may be arranged in a regularly spaced 2-dimensional array.

According to an embodiment, the component is an integrated circuit die, and the layered structure is the back end of line (BEOL) portion of the die. The dielectric material may be a low-K dielectric material.

The embodiment is also related to the use of a sensor for measuring stress in the direction perpendicular to the layers of a layered structure, the layered structure comprising multiple levels comprising electric conductors and via connections for connecting the conductors of different levels, the conductors and via connections of the levels being embedded in layers of a dielectric material.

According to an embodiment of the above-described use, a 2-dimensional array of stress sensors is included in the design of the BEOL portion of an integrated circuit chip, and the use comprises the following stages:
  Producing multiple chips on a process wafer, each chip comprising the array of sensors,
  Subjecting the process wafer to mechanical stress,
  Measuring the stress at the locations of the sensors, thereby determining any weak points in the BEOL portion of the chip,
  If weak points are detected, re-designing the BEOL portion so as to remove the weak points.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
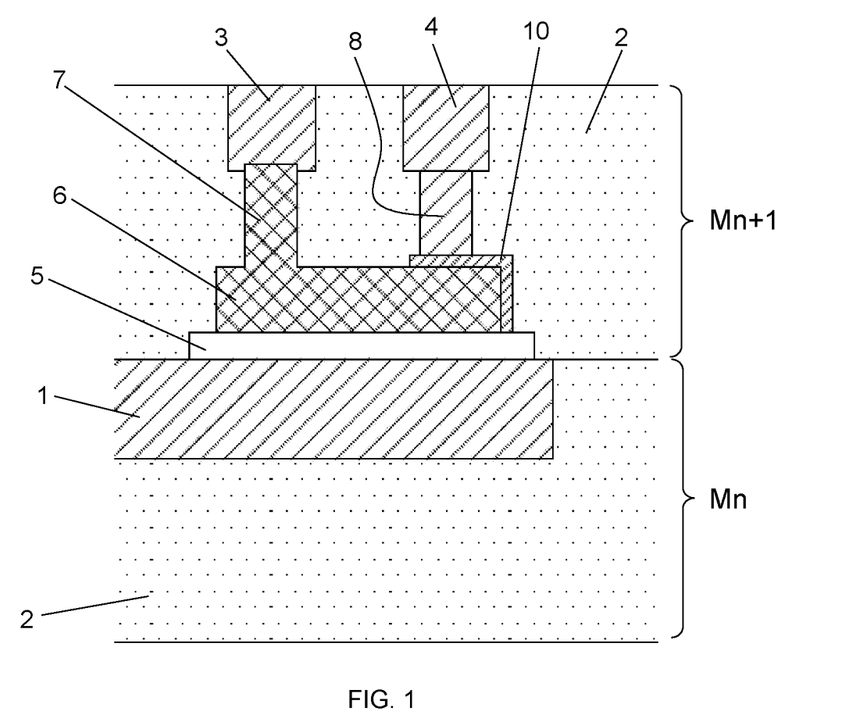
FIG. 1 illustrates the structure of a stress sensor, according to an example embodiment.

An embodiment of the sensor corresponds to a field-effect transistor incorporated in a layered metallization structure such as the back end of line (BEOL) portion of an integrated circuit die. FIG. 1 illustrates the implementation of a sensor in the BEOL portion of an IC. The drawing shows two metallization levels $M_n$ and $M_{n+1}$. The first level $M_n$ comprises a conductor 1 which may be a metal line, embedded in a dielectric material 2, known as the inter-layer dielectric (ILD) or pre-metal dielectric (PMD) if $M_n$ is the first metallization level Mi. The dielectric 2 may be a low-K dielectric material as known in the art. The second level $M_{n+1}$ equally comprises ILD material 2, and further comprises two parallel conductor lines 3 and 4. On top of the conductor 1, a gate dielectric 5 is provided, as well as a channel 6 formed of a semiconductor material. The gate dielectric 5 may be formed of silicon nitride (SiN), Aluminum oxide ($Al_2O_3$) or Hafnium Oxide ($HfO_2$) for example, or any other material or stack of materials qualifying as a high quality gate dielectric. The channel 6 is electrically connected to the two conductors 3 and 4 in level $M_{n+1}$ by two respective connected vias 7 and 8. The conductor 1 acts as the gate electrode of the transistor, with the vias 7 and 8 acting respectively as source and drain electrodes or vice versa, depending on how the sensor is connected to a voltage source and to a reference or ground potential. The electrodes are accessible via terminals on the exterior of the IC and connected to the electrodes 1, 7 and 8 via the BEOL network. According to the embodiment, at least one of the vias 7 and 8 is formed of a material whose electrical resistance is sensitive to mechanical stress in the direction perpendicular to the layers of the BEOL. In the embodiment shown in FIG. 1, the left-hand via 7 is such a stress-sensitive via, while the right-hand via 8 is made of a standard low-resistive material used for BEOL processing, e.g. copper. The stress-sensitive via 7 is termed 'pseudo-via' hereafter.

Materials suitable for the pseudo-via exhibit sensitivity of the electrical resistance to mechanical stress in the direction of a current passing through the pseudo-via. The materials may be doped in order to tune the resistance. Suitable materials are amorphous silicon, polycrystalline silicon (commonly referred to as polysilicon) and crystalline silicon. Metal oxides may also be used. One example of a suitable metal oxide is Indium Gallium Zinc Oxide (IGZO), either in amorphous or polycrystalline state or in C-axis aligned crystalline state. The polycrystalline state of a material is a state wherein the material consists of multiple grains with random crystallographic orientations. The sensitivity of polysilicon to mechanical stress has been studied, as illustrated for example in the document 'Piezoresistive pressure sensors based on polycrystalline silicon', Mosser et al, Sensors and Actuators, A: Physical, Vol. 2, Issue 2, July 1991, p. 113-132. Amorphous silicon is a particularly useful material for the purpose of integrating the sensor of the embodiment in an integrated circuit die, as the thermal budget for processing amorphous silicon is compatible with standard BEOL processing. Polysilicon requires a higher thermal budget compared to amorphous silicon, and is therefore a suitable, albeit less so for use in a sensor of the embodiment.

According to example embodiments, the stress sensitivity of the resistance of the material of the pseudo-via is higher than or equal to 50 ppm/MPa. The sensitivity is a relative value, expressing the relation dR/R when a stress of one MPa is applied in the direction of a current passing through the pseudo-via, with R the resistance of the pseudo-via when no stress is applied.

Figure 2:
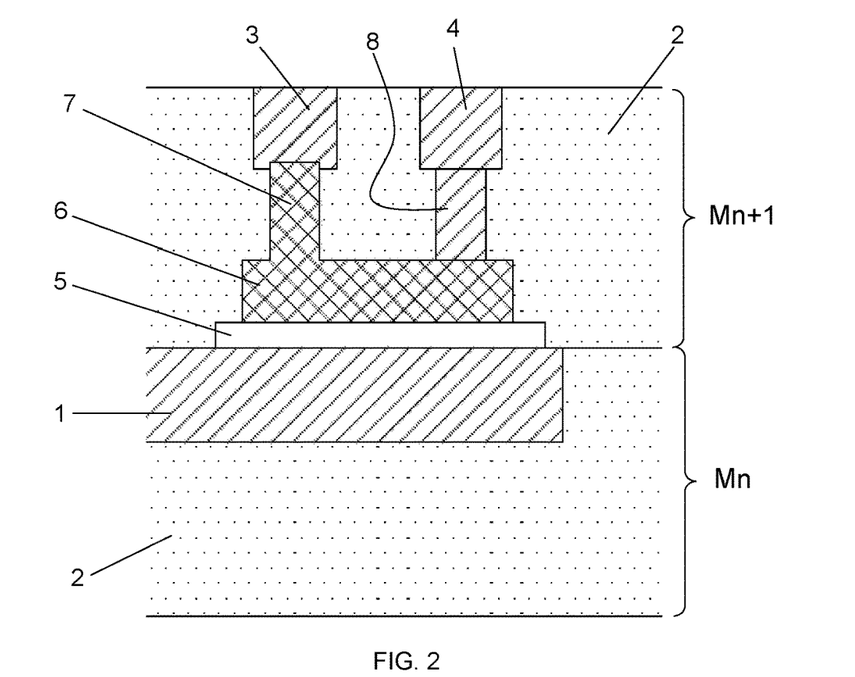
FIG. 2 illustrates a sensor where there is no contact material between the standard via and the channel, according to an example embodiment.

In the embodiment shown in FIG. 1, the channel 6 is made of the same material as the pseudo-via 7, for example both the channel 6 and the pseudo-via 7 may be produced from a single layer of amorphous silicon by a sequence of patterning steps (see further). Alternatively, the channel 6 may be formed of a different material than the pseudo-via 7. For example, the channel 6 could be produced from Indium Gallium Zinc Oxide (IGZO), with the pseudo-via 7 made of amorphous silicon or polysilicon. The channel 6 may also be doped in order to tune the resistivity. When the channel 6 and the pseudo-via 7 are formed of the same material, these regions may be doped at the same or at different dopant densities. The latter option may facilitate tuning the resistivity in a different way in both cases, in accordance with the respective function of the pseudo-via and the channel and thereby optimize the sensor's performance. Further in the case of the embodiment of FIG. 1, a portion 10 formed of a contact material is provided between the standard via 8 and the channel 6, for reducing the contact resistance between these two areas. The contact material portion 10 may for example be produced by applying and patterning a layer of chrome. The contact material 10 may be applied in some example embodiments, but its presence is not mandatory. FIG. 2 shows a sensor according to an embodiment wherein this contact material is not applied.

Figure 3:
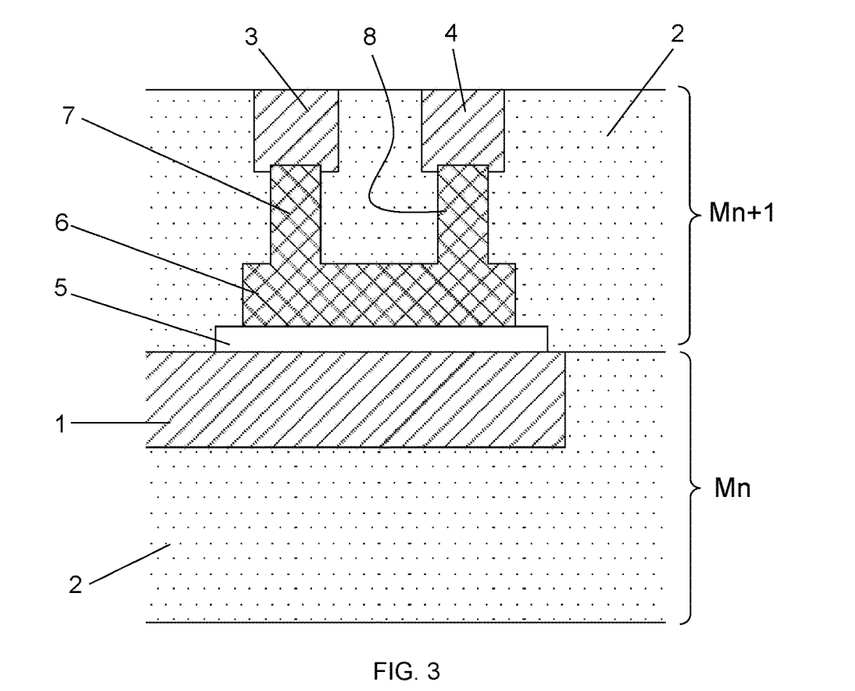
FIG. 3 illustrates a sensor wherein both the first and the second via are pseudo-vias, according to an example embodiment.

According to another embodiment illustrated in FIG. 3, both vias 7 and 8 are pseudo-vias, i.e. both are produced from a stress-sensitive material, and in some example embodiments from the same material, with the channel 6 formed of the same material or of a different material. Embodiments including two stress-sensitive pseudo-vias exhibit a higher sensitivity of the sensor. As both source and drain are stress sensitive, the stress has a greater impact on the current. Further in these embodiments having two pseudo-vias, the process cost decreases, as no separate processes are needed for producing the source and drain. It is also possible to provide multiple vias which together form the source and/or multiple vias which together form the drain.

It is contemplated that in some implementations, the various parameters of a sensor may be tuned according to the embodiment in order to ensure that the sensitivity of the pseudo-via to the mechanical stress is sufficient to facilitate measurement of the stress by reading out the drain current of the transistor when the transistor is in the ON state. The drain voltage and the transistor dimensions can be chosen to have optimal $I_{on}/I_{off}$ ratio while the ON current is dominated by the resistance of the pseudo-via. Using in-situ doping, the doping in the pseudo-via or vias 7 can be tuned to obtain a suitable range of the resistance with respect to the channel resistance. The pseudo-via resistance should be sufficiently large to dominate the channel resistance in the ON state.

An example of suitable dimensions and other parameters is given hereafter, for a sensor as illustrated in FIG. 1, having one pseudo-via 7 formed of amorphous silicon, the channel 6 also formed of amorphous silicon, the gate dielectric 5 formed of silicon nitride, the standard via 8 and the gate electrode 1 formed of copper. The ILD material 2 is silicon oxide, with a dielectric constant of approximately 3. Further parameters are listed hereafter:

Thickness of the $M_{n+1}$ interlayer dielectric: 400 nm
Thickness of the channel: 100 nm,
gate length: 1 μm
gate thickness: 100 nm Cu (gate electrode 1), and 5 nm of SiN (gate dielectric 5)
height of the vias 7 and 8: 300 nm
channel doping level: $1e15/cm^3$ (dopant:phosphorus)
pseudo-via doping level: $1e16/cm^3$ (dopant:phosphorus)
drain voltage: 0.8V
gate voltage: 3V
contact material 10: aluminum (20 nm thick)

From a simulation based on the above parameters, the sensitivity of the device was found to be 1 nA/MPa, which facilitates the measurement of the mechanical stress levels occurring in the BEOL during packaging or related process steps.

Figure 4:
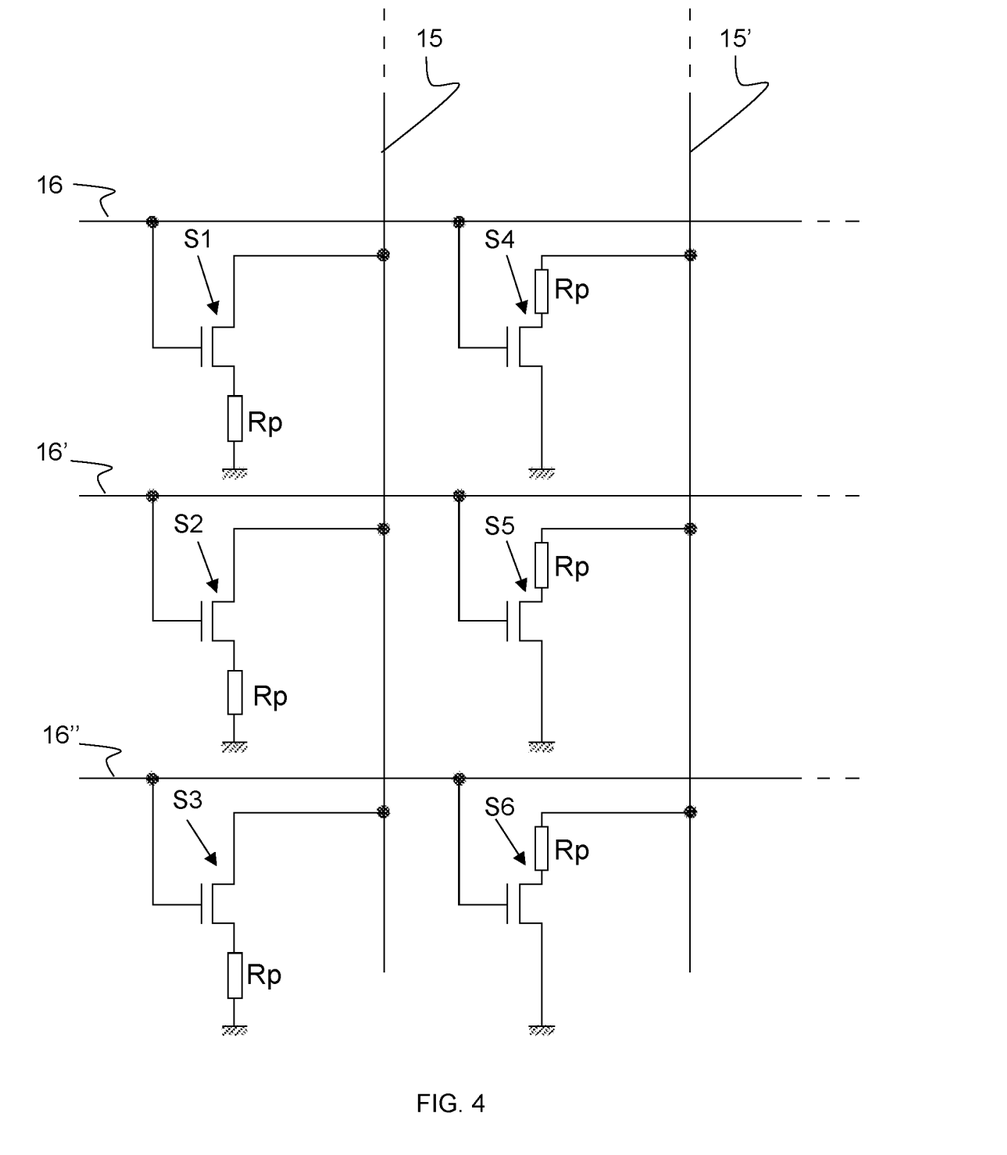
FIG. 4 illustrates how multiple sensors can be connected, according to an example embodiment.

The embodiment is related to the sensor as such, and to any micro-electronic component, in particular any integrated circuit die, comprising a layered metallization structure wherein at least one sensor according to the embodiment is incorporated. In some examples, a plurality of sensors may be implemented in a single layered metallization structure, such as the BEOL portion of an IC, allowing the measurement of stress at different locations. One particular embodiment concerns a matrix of connected sensors distributed across the area of the chip. The sensor according to FIG. 1 is similar to a standard DRAM cell (Dynamic Random Access Memory), with the capacitor of the DRAM cell replaced by a resistor, formed by the pseudo-via 7. A plurality of sensors according to the embodiment may therefore be distributed across the surface of the BEOL portion of an IC, and connected in the manner of an array of DRAM cells, by bit lines and word lines. This architecture is illustrated in FIG. 4, which represents a 2-dimensional array of sensors, six of which are shown in the drawing (labelled S1 to S6). The sensors S1, S2, S3 are coupled to a first bit line 15, while the sensors S4, S5, S6 are coupled to a second bit line 15', the bit lines defining the columns of the array. The word lines 16, 16' and 16" connect the respective gates of the sensors arranged in the same row of the array. The pseudo-vias are symbolized by resistors $R_p$. The pseudo via is coupled to the source side in the sensors S1-S3 and to the drain side in the sensors S4-S6, illustrating that the position of the pseudo-via may be freely chosen. Some or all sensors could be equipped with two pseudo-vias, both on the source and the drains side. As normally only one sensor in a column of the array is in the ON state at the same time during a measurement, the number of sensors coupled to the same bit line must take into account the leakage current of a single sensor in the off-state, in order for the current from a single sensor in the ON state to be distinguishable from the sum of the leakage currents of the off-state sensors coupled to the same bit line. A current detector may be provided for each bit line, in which case currents can be read out simultaneously for all the bit lines. Alternatively, a single current detector may be provided for the array, and the bit line currents are read-out in a time-multiplexed manner.

In some embodiments, the sensors may be arranged in a regularly spaced 2-dimensional array that covers all or the majority of the surface area of the BEOL portion. The architecture as described above allows to measure mechanical stress across a given surface of the BEOL portion of an IC, or of any similar layered metallization structure, to thereby obtain a 2-dimensional stress map. The stress map directly reveals any weak points in a BEOL design, at locations of stress sensors at which the measured stress levels approach or exceed a predefined threshold that may be associated with crack formation or delamination. Both the current that is read out in the absence of mechanical stress and at the threshold may be determined beforehand by a calibration procedure. The embodiment is related to any micro-electronic component wherein this architecture is incorporated. In particular the embodiment is related to integrated circuit dies comprising the above-described architecture in its BEOL portion.

An interconnected sensor array as described above may be used to detect the weak points in a BEOL design prior to a possible re-design of the BEOL, so that the re-design is no longer done on a trial-and-error basis. For example, the following use case may be adopted:

1) When a new BEOL layout is proposed, the stress sensors according to the embodiment are included in the design and a first process wafer is manufactured with this design, i.e. a wafer comprising multiple ICs comprising the BEOL design in question.
2) This first wafer is stressed mechanically (e.g. 4 pt bending, nano-indenter). The stress sensors are read-out to identify which points of the BEOL layout are the most sensitive.
3) If the BEOL needs to be redesigned (which can be determined either by applying packaging to this wafer, or based only on the readings of the sensors), then only the area around that weak point needs to be redesigned. Therefore, only a small modification is needed, and no iteration is required.

After this sequence, the stress sensors are not necessarily processed on the next wafers, which are already supposed to be robust against BEOL cracking thanks to the redesign (or if no weak points are identified).

The inclusion of stress sensors according to the embodiment in an integrated circuit chip does not negatively influence the power consumption of the IC. The sensors are not active during normal operation of the chip. From the use case described above, it is clear that the sensors are only used during the assessment of the stress, and that the stress sensors may even be left out of the BEOL layout, once they have established that the layout is resistant to crack formation. The sensor of the embodiment therefore has a minimal impact on the power consumption of the IC.

Figure 5A:
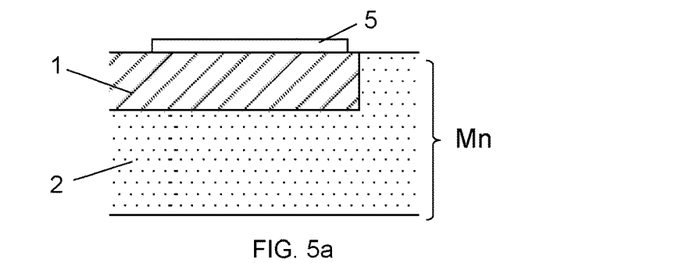
FIGS. 5a to 5i illustrate possible method steps for the fabrication of a sensor. according to an example embodiment.
Figure 5B:
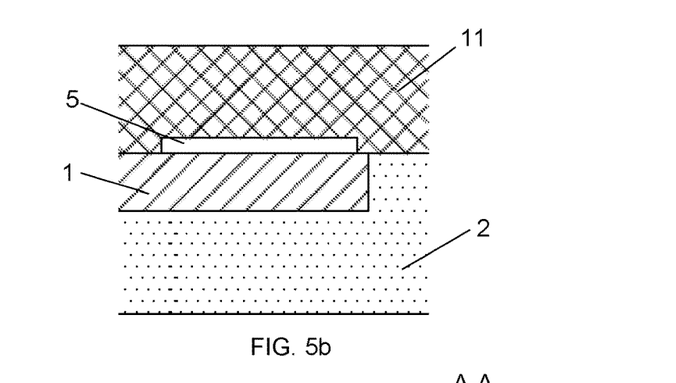
Figure 5C:
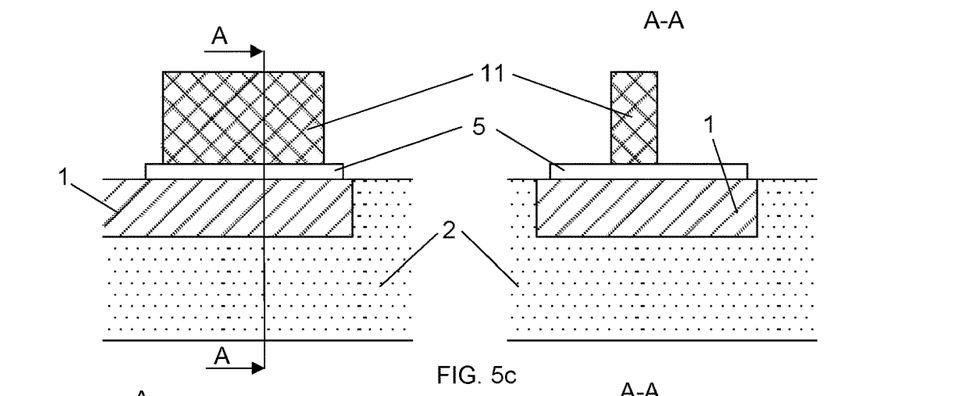
Figure 5D:
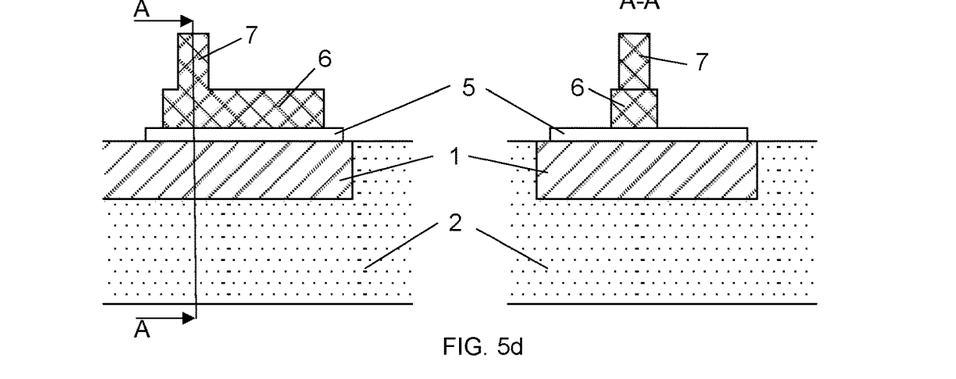
Figure 5E:
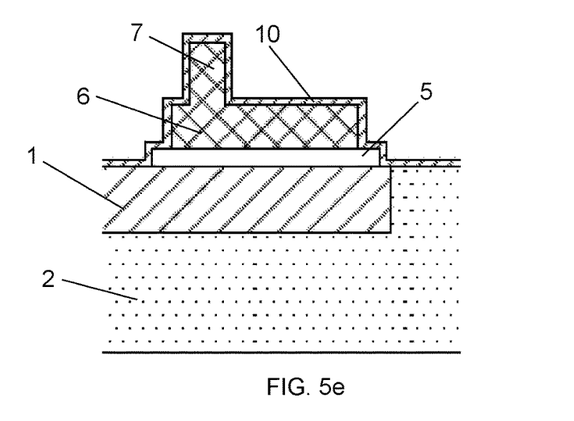
Figure 5F:
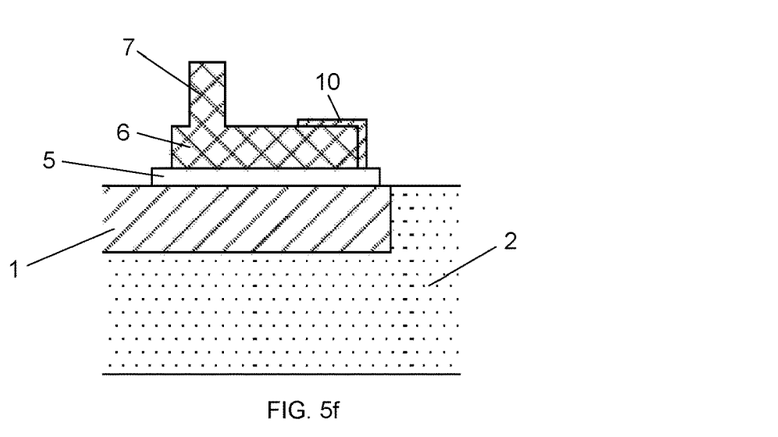
Figure 5G:
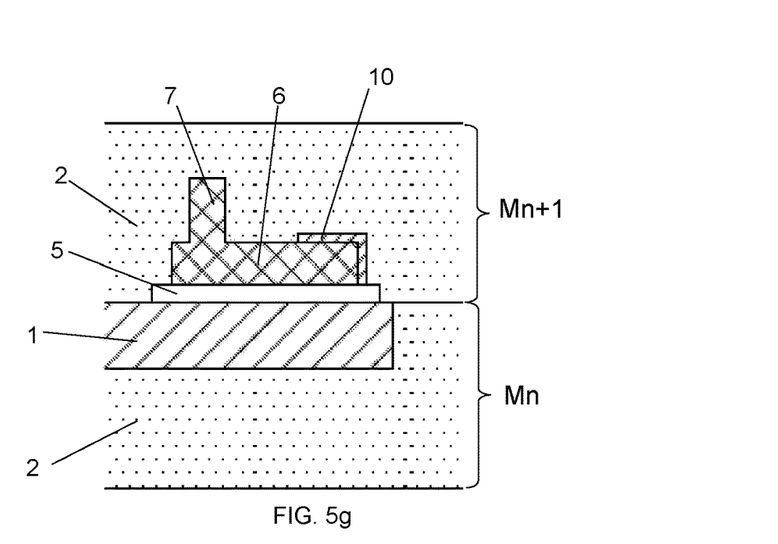
Figure 5H:
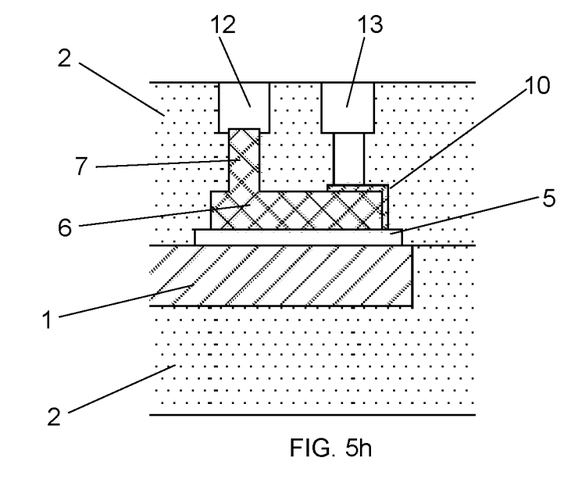
Figure 5I:
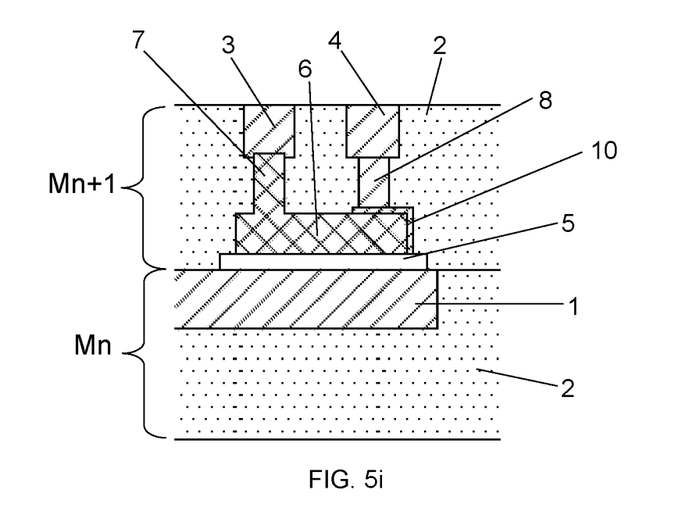

FIGS. 5a to 5i illustrate possible process steps for manufacturing the sensor according to FIG. 1. The sensor structure is similar to the known TFT (thin film transistor), and a number of process steps known from this technology may be applied for making a sensor according to the embodiment. The method will be explained for the case of the pseudo-via 7 and the channel 6 being both formed of amorphous silicon. The method steps are applied on a semiconductor wafer, in the course of BEOL processing. FIG. 5a shows the status after completion of the level $M_n$, including the first conductor 1, the ILD 2 and the gate dielectric layer 5. This layer may be applied in accordance with known TFT technology. Then a layer 11 of amorphous silicon may be deposited by, for example, Plasma Enhanced Chemical Vapor Deposition (PECVD), as shown in FIG. 5b, and patterned by a series of lithography and etch steps, to produce the channel 6 as an block of amorphous silicon, with the pseudo-via 7 extending upward from the channel, as shown in FIGS. 5c and 5d. The contact material, for example a chrome layer 10, is then deposited, for example by Physical Vapor Deposition (PVD) or Atomic Layer Deposition (ALD) and patterned, see FIGS. 5e and 5f, followed by the deposition of the ILD layer 2 of the level $M_{n+1}$, which encapsulates the structure formed by the gate dielectric 5, the channel 6, the contact material layer 10 and the pseudo-via 7 (FIG. 5g). By standard litho and etch steps (FIG. 5h), the ILD layer 2 of level $M_{n+1}$ is patterned to form openings 12 and 13 in view of the formation of the conductors 3 and 4 and the standard via 8. In some examples, an over-etch is applied so that the pseudo-via 7 protrudes from the bottom of the opening 12, this in order to ensure an optimal contact between the pseudo-via 7 and the conductor 3. The conductors 3, 4 and the standard via 8 are then created by filling the openings 12 and 13 with metal or any other suitable conductive material, in accordance with standard damascene-type processing (FIG. 5i).

While the embodiments have been illustrated and described in detail in the drawings and foregoing description, such illustration and description are to be considered illustrative or exemplary and not restrictive. Other variations to the disclosed embodiments can be understood and effected by those skilled in the art in practicing the claimed stress sensor, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A stress sensor incorporated in a layered structure, the layered structure comprising multiple levels ($M_n$, $M_{n+1}$) comprising electric conductors and via connections for interconnecting conductors of different levels, the conductors and via connections of the levels being embedded in layers of a dielectric material, the stress sensor comprising:
   a first conductor in a first level ($M_n$) of the layered structure, the first conductor performing a function of a gate electrode of a transistor;
   a dielectric layer in contact with the first conductor, the dielectric layer performing a function of a gate dielectric of the transistor;
   a portion of semiconductor material on the dielectric layer, the portion of semiconductor material performing a function of a channel of the transistor; and
   a first via and a second via in electrical contact with the channel, the first via and the second via respectively performing a function of source and drain electrodes of the transistor, the first via and the second via being electrically connected to respective conductors in a second level ($M_{n+1}$) adjacent to the first level ($M_n$),
   wherein at least one of the first via and the second via corresponds to a pseudo-via that is formed of a material having an electrical resistance that is sensitive to mechanical stress acting on the layered structure in a direction of the first via and the second via, and wherein a sensitivity of the resistance of the pseudo-via to the mechanical stress is sufficient to facilitate measurement of the stress by reading out the drain current of the transistor, when the transistor is in an ON state.

2. The stress sensor according to claim 1, wherein the channel and the pseudo-via are formed of a same material.

3. The stress sensor according to claim 2, wherein the pseudo-via and the channel are doped and wherein a dopant density in the pseudo-via differs from a density in the channel.

4. The stress sensor according to claim 2, wherein the pseudo-via is formed of amorphous silicon or polycrystalline silicon.

5. The stress sensor according to claim 2, wherein the pseudo-via is formed of Indium Gallium Zinc Oxide (IGZO).

6. The stress sensor according to claim 2, wherein both the first via and the second via correspond to pseudo-vias.

7. The stress sensor according to claim 1, wherein the pseudo-via is formed of amorphous silicon or polycrystalline silicon.

8. The stress sensor according to claim 1, wherein the pseudo-via is formed of Indium Gallium Zinc Oxide (IGZO).

9. The stress sensor according to claim 1, wherein both the first via and the second via correspond to pseudo-vias.

10. The stress sensor according to claim 1, wherein only the first via is a pseudo-via, and wherein the second via is connected to the channel through a contact material between the second via and the channel.

11. The stress sensor according to claim 1, wherein the sensitivity of a resistance of the pseudo-via is higher than or equal to 50 ppm/MPa.

12. A micro-electronic component comprising a layered structure, the layered structure comprising multiple levels ($M_n$, $M_{n+1}$) comprising electric conductors and via connections for interconnecting the conductors of different levels, the conductors and via connections of the levels being embedded in layers of a dielectric material, and wherein at least one sensor according to claim 1, is incorporated in the layered structure of the micro-electronic component.

13. The component according to claim 12, wherein multiple sensors are distributed across a surface area of at least part of the layered structure, and wherein the multiple sensors are accessible through word lines coupled to gate electrodes of the sensors, and through a plurality of bit lines, each bit line interconnecting the source or drain electrodes of a subgroup of sensors.

14. The component according to claim 13, wherein the sensors are arranged in a regularly spaced 2-dimensional array.

15. The component according to claim 13, wherein the component is an integrated circuit die, and wherein the layered structure is a back end of line (BEOL) portion of a die.

16. The component according to claim 13, wherein the dielectric material is a low-K dielectric material.

17. The component according to claim 12, wherein the component is an integrated circuit die, and wherein the layered structure is a back end of line (BEOL) portion of a die.

18. The component according to claim 12, wherein the dielectric material is a low-K dielectric material.

19. A use of a sensor according to claim 1 for measuring stress in the direction perpendicular to layers of a layered structure, the layered structure comprising multiple levels ($M_n$, $M_{n+1}$) comprising electric conductors and via connections for interconnecting the conductors of different levels, the conductors and via connections of the levels being embedded in layers of a dielectric material.

20. The use according to claim 19, wherein a 2-dimensional array of stress sensors is included in a design of a BEOL portion of an integrated circuit chip, and wherein the use comprises:
producing multiple chips on a process wafer, each chip comprising the 2-dimensional array of stress sensors;
subjecting the process wafer to mechanical stress;
measuring the stress at locations of the 2-dimensional array of stress sensors, thereby determining any weak points in the BEOL portion of the chip; and
if weak points are detected, re-designing the BEOL portion so as to remove the weak points.

\* \* \* \* \*